(12) United States Patent
Christensen et al.

(10) Patent No.: US 10,141,611 B2
(45) Date of Patent: Nov. 27, 2018

(54) INTERNAL SHORT DETECTION AND MITIGATION IN BATTERIES

(71) Applicant: Robert Bosch GmbH, Stuttgart (DE)

(72) Inventors: John F. Christensen, Elk Grove, CA (US); Aleksandar Kojic, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 197 days.

(21) Appl. No.: 14/972,957

(22) Filed: Dec. 17, 2015

(65) Prior Publication Data
US 2017/0179538 A1  Jun. 22, 2017

(51) Int. Cl.
| | |
|---|---|
| *H01M 10/42* | (2006.01) |
| *H01M 2/16* | (2006.01) |
| *H01M 10/0525* | (2010.01) |
| *H01M 10/48* | (2006.01) |
| *G01R 31/36* | (2006.01) |
| *G01R 31/02* | (2006.01) |
| *G01R 31/44* | (2006.01) |
| *H01M 10/052* | (2010.01) |

(52) U.S. Cl.
CPC ........ *H01M 10/425* (2013.01); *G01R 31/025* (2013.01); *G01R 31/3606* (2013.01); *G01R 31/3658* (2013.01); *G01R 31/3679* (2013.01); *G01R 31/44* (2013.01); *H01M 2/16* (2013.01); *H01M 10/0525* (2013.01); *H01M 10/4235* (2013.01); *H01M 10/48* (2013.01); *H01M 10/052* (2013.01); *H01M 2010/4271* (2013.01); *H01M 2200/00* (2013.01)

(58) Field of Classification Search
None
See application file for complete search history.

(56) References Cited

U.S. PATENT DOCUMENTS

| | | | |
|---|---|---|---|
| 2014/0329120 A1 | 11/2014 | Cui et al. | |
| 2015/0056480 A1 | 2/2015 | Lee et al. | |
| 2015/0056484 A1* | 2/2015 | Lee ...................... | H01M 10/48 429/90 |
| 2015/0171398 A1* | 6/2015 | Roumi ................ | H01M 2/1673 429/7 |

(Continued)

OTHER PUBLICATIONS

Zhao et al., "Electrochemical Stability of Copper in Lithium-Ion Battery Electrolytes," Journal of the Electrochemical Society, 147, 2874-2879 (2000).

(Continued)

*Primary Examiner* — Carmen V Lyles-Irving
(74) *Attorney, Agent, or Firm* — Michael Best & Friedrich LLP (57) ABSTRACT

Devices, systems, and techniques for identifying a dendrite material within a battery. The method comprising receiving, by a battery management system, an output from sensing circuitry within the battery indicative of a first voltage level, detecting, by the battery management system, a change from the first voltage level to a second voltage level that is indicative of an internal short within a sensing sheet, determining by the battery management system, a resistance and a two-dimensional position of the internal short within the sensing sheet, and identifying, by the battery management system, a dendrite material based on the resistance of the internal short.

6 Claims, 11 Drawing Sheets

(56) References Cited

U.S. PATENT DOCUMENTS

2015/0171483 A1* 6/2015 Nenninger ........ H01M 10/4257
429/50

OTHER PUBLICATIONS

Wu et al., "Improving battery safety by early detection of internal shorting with a bifunctional separator," Nature Communications, 5, 1-6 (2013).

Wikipedia, "Power-line communication," Available at least as early as Aug. 11, 2015 (https://en.wikipedia.org/wiki/Power-line_communication).

* cited by examiner

INTERNAL SHORT DETECTION AND MITIGATION IN BATTERIES

FIELD

Embodiments of the invention generally relate to batteries and, more particularly, to the detection and mitigation of internal shorts caused by dendrite formation in a battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

Lithium dendrites (needle- or tree-like growths) may be formed during repeated charge/discharge cycles of a battery. The dendrites can penetrate through the separator region of the battery and cause an internal short between the negative and positive electrodes. The rapid discharge caused by the short can release excessive heat within the battery causing damage to the battery.

SUMMARY

Traditional approaches to addressing dendrite formation have included modification of the electrolyte and electrolyte solvent, and modifying the surface morphologies of the electrodes. Despite these ongoing efforts, the formation of dendrites continues to occur. Non-uniform (re)-deposition of lithium during the charge/discharge cycles of the battery often results in dendrite formation. Thus, there is a need for a system and method for the detection and mitigation of dendrites within a rechargeable battery prior to the formation of an internal short between the positive and negative electrodes.

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

One embodiment relates to a method of detecting and treating the formation of lithium dendrites in a battery, and in particular, to a method for identifying a dendrite material in the battery. In one example, the method for identifying a dendrite material in the battery includes receiving, by a battery management system, an output from sensing circuitry within a battery cell indicative of a first voltage level, detecting a change from the first voltage level to a second voltage level that is indicative of an internal short between an electrode and a sensing sheet, determining, a resistance and a two-dimensional position of the internal short on the sensing sheet, and identifying a dendrite material based on the resistance of the internal short.

Another embodiment provides a battery. In one example, the battery comprises an anode, a cathode, an electrically insulating separator, and sensing circuitry. The electrically insulating separator has a sensing sheet and located between the anode and the cathode. The electrically insulating separator electrically insulates the anode from the cathode, and includes at least three sensing tabs located at the periphery of the sensing sheet. The sensing circuitry is electrically connected to each of the three or more sensing tabs and configured to determine at least one of a resistance, a current, or a voltage at each of the three or more sensing tabs. The sensing circuitry outputs an indication of the at least one of the resistance, the current, or the voltage at each of the three or more sensing tabs.

Yet another embodiment provides a system comprising a battery and a battery management system. In one example, the battery has an anode, a cathode, an electrically insulating separator, and a sensing circuitry. The electrically insulating separator has a sensing sheet and located between the anode and the cathode. The electrically insulating separator electrically insulates the anode from the cathode, and the sensing sheet includes three or more sensing tabs located at the periphery of the sensing sheet. The sensing circuitry is electrically connected to each of the three or more sensing tabs and configured to determine at least one of a resistance, a current, or a voltage at each of the three or more sensing tabs. The sensing circuitry outputs an indication of the at least one of the resistance, the current, or the voltage at each of the three or more sensing tabs. The battery management system is communicatively connected to the battery and configured to receive the output from the sensing circuitry, and determine a resistance and a two-dimensional position of the internal short on the sensing sheet based on the output from the sensing circuitry.

The details of one or more features, aspects, implementations, and advantages of this disclosure are set forth in the accompanying drawings, the detailed description, and the claims below.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
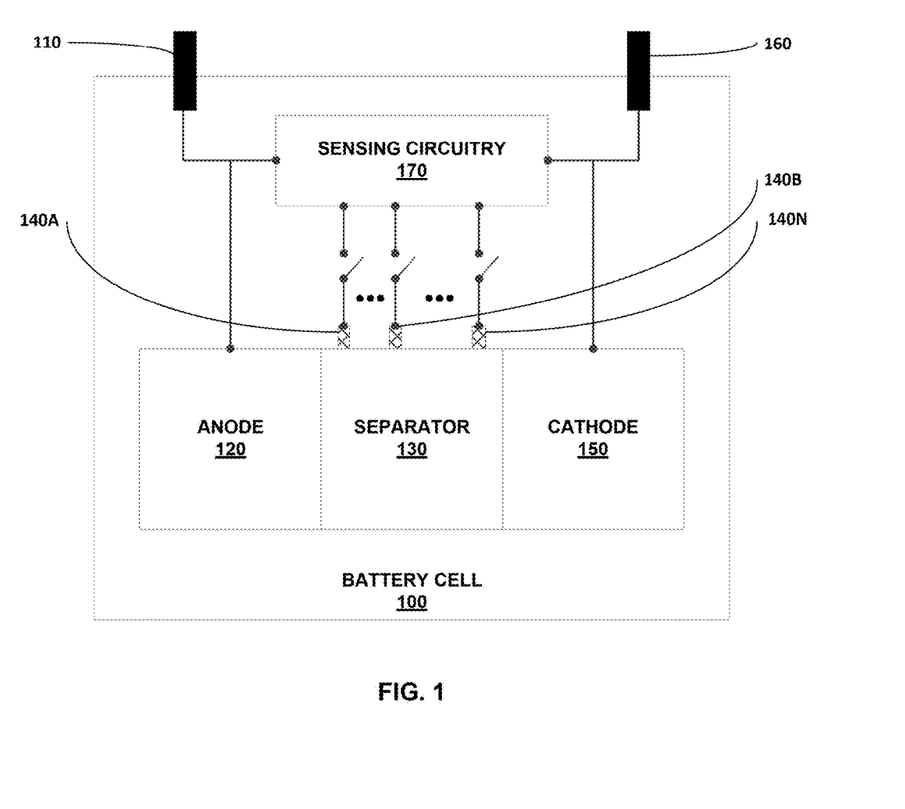
FIG. 1 is a schematic illustration of a battery cell and sensing circuitry, in accordance with one embodiment.

An embodiment of a battery cell 100 is shown in FIG. 1. In the example illustrated, the battery cell 100 includes an anode tab 110, an anode 120, a separator 130, sensing tabs 140A, 140B, and 140N (collectively "sensing tabs 140"), a cathode 150, a cathode tab 160, and sensing circuitry 170. In some examples, the separator 130 may be an electrically insulating separator. In some embodiments, the electrically insulating separator comprises a porous polymeric film. For ease of understanding the sensing tabs 140 are illustrated as positioned at the edge of the separator 130. It should be understood that in some embodiments the sensing tabs 140 are connected to a single sensing sheet (not shown) located within the separator 130.

In various embodiments the sensing circuitry 170 may be configured to measure parameters such as at least one of voltage, current, or resistance between a combination of the anode 120, a sensing sheet within the separator 130, and the cathode 150. The sensing circuitry 170 may also be configured to communicate with a device external to the battery cell 100. For example, the sensing circuitry 170 may be configured to communicate with a battery management system. In some examples, the sensing circuitry 170 may communicate with a battery management system external to the battery cell 100 by adjusting the voltage across the anode tab 110 and the cathode tab 160.

Figure 2:
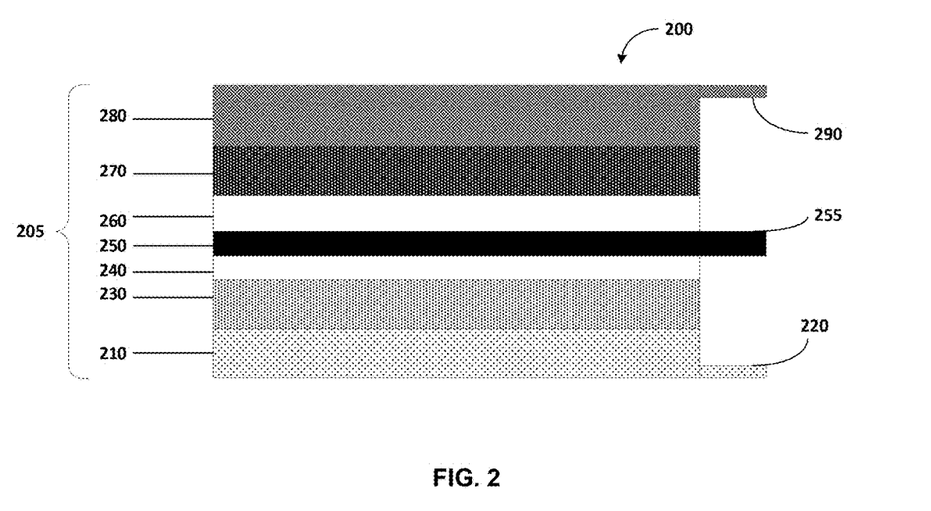
FIG. 2 is a schematic illustration of a battery cell, in accordance with one embodiment.

The battery cell 100 has a stacked architecture, which is best seen by reference to FIG. 2. FIG. 2 illustrates a battery cell 200 which is similar to the battery cell 100. In the example illustrated, the battery cell 200 includes a stack of components 205. The stack of components 205 includes an anode current collector 210, an anode current collector tab 220 attached to the anode current collector 210, and an anode 230. The battery cell 200 also includes a first separator 240 (e.g., a first electrically insulating separator), and a sensing sheet 250. The sensing sheet 250 has a sensing tab 255. A second separator 260 (e.g., a second electrically insulating separator) is located adjacent to the sensing sheet 250, opposite the first separator 240, such that the sensing sheet 250 is positioned between the first separator 240 and the second separator 260. The battery cell 200 also includes a cathode 270, a cathode current collector 280, and a cathode current collector tab 290 attached to the cathode current collector 280. In the illustrated example of FIG. 2, the first separator 240 is thinner than the second separator 260. In this way, the battery cell 200 is configured to detect a metallic dendrite growing from the anode 230 early in its formation thus minimizing its ability to cause damage within the battery cell 200.

Figure 3A:
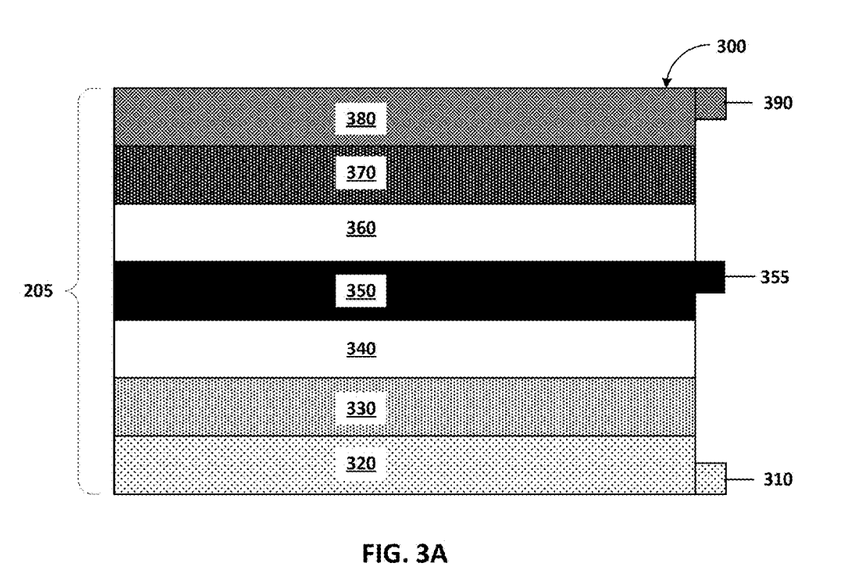
FIG. 3A is a schematic illustration of a battery cell in accordance with another embodiment.
Figure 3B:
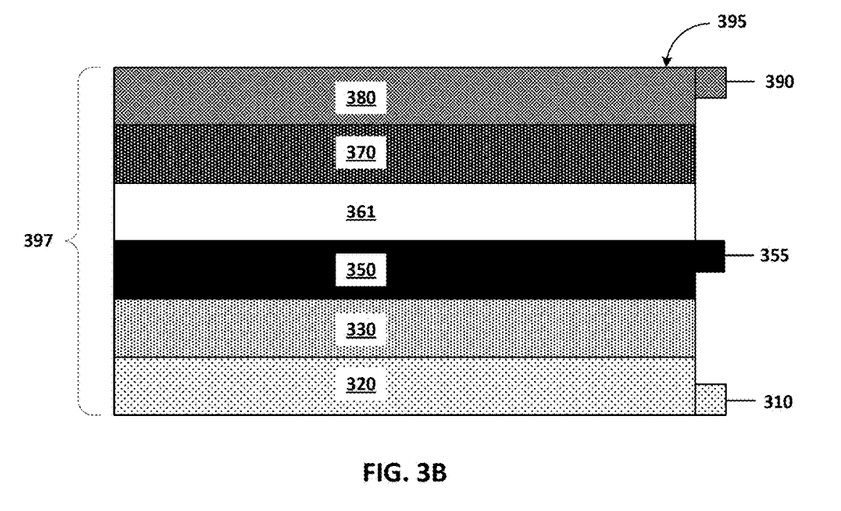
FIG. 3B is a schematic illustration of a battery cell, in accordance with certain embodiments.

Two embodiments of a battery cell are shown in FIGS. 3A and 3B. FIG. 3A illustrates a battery cell 300 that includes an anode current collector 320 that has an anode current collector tab 310, The anode current collector 320 is positioned adjacent to an anode 330. A first separator 340 is positioned adjacent the anode 330 and a sensing sheet 350, having a sensing tab 355, is positioned adjacent to the separator 240. A second separator 360 is positioned adjacent to the sensing sheet 350. Thus, the sensing sheet 350 is positioned between the first and second separators 340 and 360. The battery cell 300 also includes a cathode 370 and a cathode current collector 380, which has a cathode current collector tab 390. FIG. 3B illustrates a battery cell 395. The battery cell 395 includes a stack of components 397. The battery cell 300 and the battery cell 395 are the same except that instead of a first separator 340 and a second separator 360, the battery cell 395 includes a separator 361 between the sensing sheet 350 and the cathode 370, which is similar to second separator 360 as described in FIG. 3A. In the illustrated example of FIG. 3A, a thickness of the first separator 340 and a thickness of the second separator 260 are substantially similar. In this way, the battery cell 300 is configured to detect a dendrite formed on the cathode 270 at a time similar to a dendrite formed on the anode 230, assuming that the dendrites occur at similar times and grow at similar rates.

In the battery cells 300 and 395, the sensing sheet 350 is located adjacent to at least one separator. However, the sensing sheet 350 may be located in other positions within the battery cell 300 or 395, as the case may be. In certain embodiments, the anode 330 may include an electrically insulating buffer layer, such as aluminum oxide ($Al_2O_3$), between the anode 330 and separator 340. In one embodiment, the inclusion of the electrically insulating buffer layer may allow the sensing sheet 350 to be placed adjacent to the anode 330 without a separator 340 between the separator 340 and anode 330. It is understood the electrically insulating buffer layer is a safety factor layer of anode 330. The lack of a separator (e.g., the first separator 340) between the sensing sheet 350 and the anode 330 allows the sensing sheet 350 to be spatially located in closer proximity to the anode 330. Earlier detection of dendrite formation is possible with such configurations because shorter dendrites may be detected when the sensing sheet 350 is closer to an electrode (e.g., the anode 330). Similarly, if early detection of dendrite formation at the cathode 370 is desired the sensing sheet 350 may be similarly placed closer to the cathode 370 by placing the separator 361 between the anode 330 and the sensing sheet 350 instead of between the cathode 370 and the sensing sheet 350 as illustrated in the example of FIG. 3B. In various embodiments the thickness dimension of the components of the battery cells 300, 395 may be for the anode current collector 320 about 10 to 15 micrometers, the anode 330 about 5 to about 100 micrometers, the separator 340 less than about 10 micrometers or in certain embodiments about 2 to about 3 micrometers, the sensing sheet 350 about 50 to about 100 nanometers, the separator 360 about 10 to about 25 micrometers, the cathode 370 about 50 to about 100 micrometers, the cathode current collector 380 about 10 to about 20 micrometers.

As noted above, dendrite formation occurs during charge/discharge cycles. In the text that follows, a description of a charge/discharge cycle of battery cell 395 is provided. However, the concepts discussed also apply to the battery cells 100, 200, and 300.

During the discharge of battery cell 395, lithium is oxidized at the anode 330 to form a lithium ion. The lithium ion migrates through the separator 361 of the battery cell 395 to the cathode 370. During charging the lithium ions return to the anode 330 and are reduced to lithium. The lithium may be deposited as lithium metal on the anode 330 in the case of a lithium anode 330 or inserted into the host structure in the case of an insertion material anode 330, such as graphite, and the process is repeated with subsequent charge and discharge cycles. In the case of a graphitic or other Li-insertion electrode, the lithium cations are combined with electrons and the host material (e.g., graphite), resulting in an increase in the degree of lithiation, or "state of charge" of the host material. For example, x Li$^+$+x e$^-$+C$_6$→Li$_x$C$_6$. Too high a charging current can result in Li metal deposition at the surface of the negative electrode, which in turn could lead to non-uniform deposition of lithium resulting in the development of a lithium dendrite on the surface of the anode 330. Without mitigation, as the length of the dendrite grows, the dendrite can span the separator 361 and form an internal short between the anode 330 and cathode 370. The placement of a sensing sheet 350 intermediate between the anode 330 and the cathode 370 allows for the detection and identification of dendrite formation prior to the dendrite forming an internal short between the anode 330 and the cathode 370. In other words, the placement of the sensing sheet 350 between the anode 330 and the cathode 370 allows for a different internal short between either the anode 330 or the cathode 370 and the sensing sheet 350, such that dendrite formation can be detected and identified. Additionally, in some examples, the dendrite formation may also be mitigated to prevent a typical internal short between the anode 330 and the cathode 370.

The anode 330 may comprise an oxidizable metal, such as lithium or an insertion material that can insert Li or some other ion, such as Na, Mg, etc. The cathode 370 may comprise various materials such as sulfur or sulfur-containing materials (e.g., polyacrylonitrile-sulfur composites (PAN-S composites), lithium sulfide (Li$_2$S)); vanadium oxides, such as vanadium pentoxide (V$_2$O$_5$); metal fluorides, such as fluorides of titanium, vanadium, iron, cobalt, bismuth, copper and combinations thereof; lithium-insertion materials, such as lithium nickel manganese cobalt oxide (NMC), lithium-rich NMC, lithium nickel manganese oxide (LiNi$_{0.5}$Mn$_{1.5}$O$_4$), lithium-rich layered oxides, such as, lithium cobalt oxide (LiCoO$_2$), lithium iron phosphate (LiFePO$_4$), lithium manganese oxide (LiMn$_2$O$_4$), lithium nickel cobalt aluminum oxide (NCA), and combinations thereof The particles may further be suspended in a porous, electrically conductive matrix that includes polymeric binder and electronically conductive material such as carbon (carbon black, graphite, carbon fiber, etc.). In some examples, the cathode may comprise an electrically conductive material having a porosity of greater than 80% to allow the formation and deposition/storage of oxidation products such as lithium peroxide (Li$_2$O$_2$) or lithium sulfide, (Li$_2$S) in the cathode volume. The ability to deposit the oxidation product directly determines the maximum power obtainable from the battery cell. Materials which provide the needed porosity include carbon black, graphite, carbon fibers, carbon nanotubes, and other non-carbon materials. The pores of the cathode 370, separators 340, 360, 361, sensing sheet 350, and anode 330 are filled with an ionically conductive electrolyte that contains a salt such as lithium hexafluorophosphate (LiPF$_6$) that provides the electrolyte with an adequate conductivity which reduces the internal electrical resistance of the battery cell. The electrolyte solution enhances ionic transport within the battery cell. Various types of electrolyte solutions are available including, non-aqueous liquid electrolytes, ionic liquids, solid polymers, glass-ceramic electrolytes, and other suitable electrolyte solutions.

The anode current collector 320 and cathode current collector 380 are electrically conductive materials that conduct electrons between the electrode and electrode tabs of the cell. The materials of current collectors may also be efficient thermal conductors, which allow heat generated within the battery cell 300, 395 to be dissipated outside the battery cell 300, 395. In some examples, the current collectors may include various metals or carbon based materials. In some examples, the current collectors may include graphite, aluminum, copper, gold, platinum, magnesium, or titanium. In various embodiments the current collector materials may be chosen such that the current collector tabs 310 and 390 are resistant to potential deleterious effects caused by exposure to the atmosphere allowing the current collector tabs 310 and 390 to act as electrical contacts external to the battery cell 395. In certain embodiments the anode current collector 320 may be copper and the cathode current collector 380 may be aluminum.

The separator 361 of FIG. 3B or first and second separators 340 and 360 as described in FIG. 3A may comprise one or more electrically insulating ionic conductive materials. In some examples, the suitable materials for separator 361 may include porous polymers, ceramics, and two dimensional sheet structures such as graphene, boron nitride, and dichalcogenides.

Figure 4:
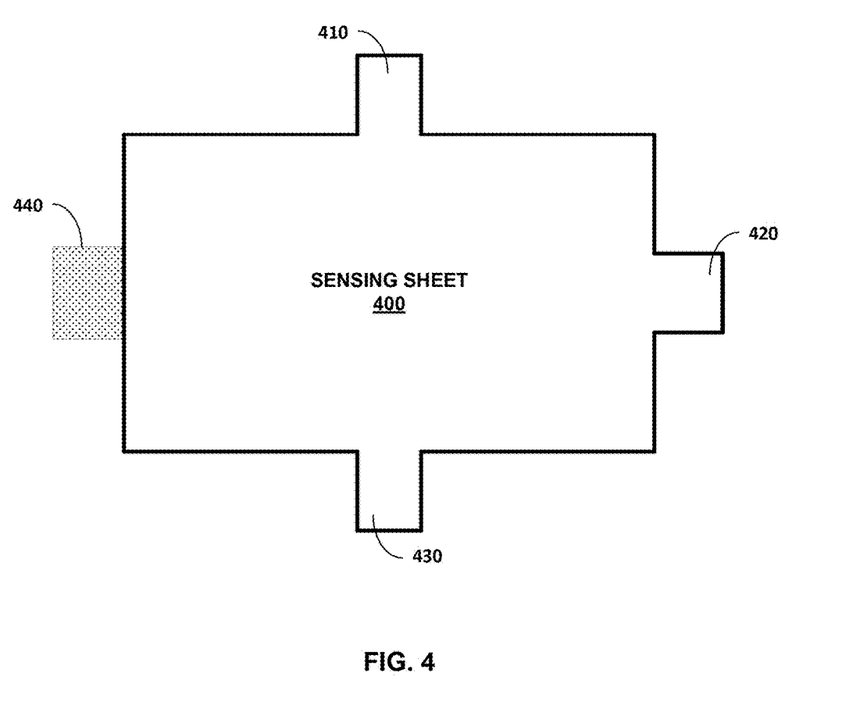
FIG. 4 is a schematic illustration of a sensing sheet within a battery cell, in accordance with one embodiment.

An embodiment of a sensing sheet 400 is shown in FIG. 4. In the example of FIG. 4, the sensing sheet 400 includes sensing tabs 410, 420, and 430 along the periphery of the sensing sheet 400. FIG. 4 also includes, an anode current collector tab 440 connected to an anode below the sensing sheet 400. In the illustrated example of FIG. 4, the sensing sheet 400 has three sensing tabs 410, 420, and 430 along the periphery of the sensing sheet 400, however, a different number of additional sensing tabs may be used along the periphery of the sensing sheet 400 provided the sensing tabs remain spatially separated from each other.

In an embodiment, the sensing sheet 400 and sensing tabs 410, 420, 430 may be formed from a thin layer of an electrically conductive material. In some examples, the electrically conductive material may include a metal selected from a group consisting of copper, aluminum, titanium, platinum, gold, and combinations thereof. In one example, the sensing sheet 400 may be a single layer. In another example, the sensing sheet 400 may be a multilayered sheet with combination of various conductive/conductive material or conductive/non-conductive material. In yet another example, the sensing sheet 400 may be a flexible sheet, a foldable sheet, or a combination thereof.

Figure 5A:
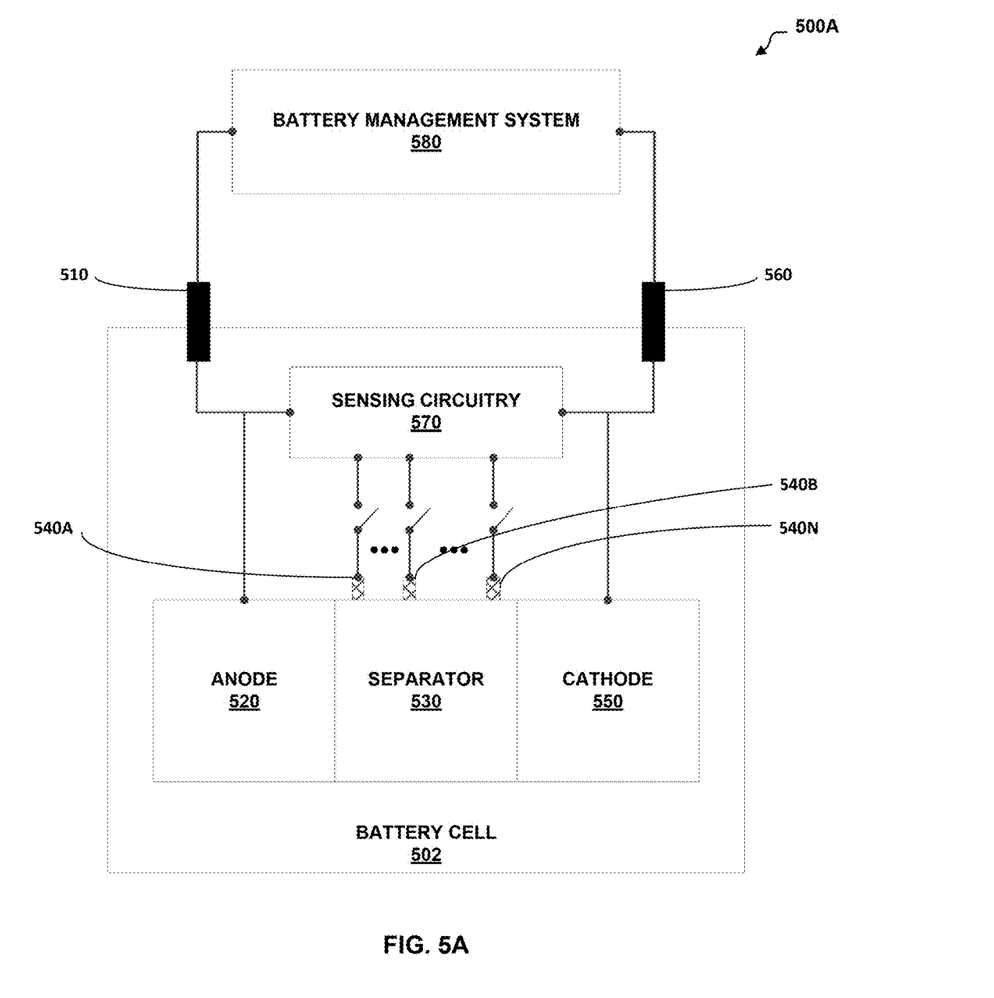
FIGS. 5A and 5B are schematic illustrations of a battery system including a battery cell and a battery management system, in accordance with some embodiments.

An embodiment of a battery system 500A is shown in FIG. 5A. The battery system includes an anode tab 510, an anode 520, a separator 530, sensing tabs 540A, 540B, and 540N (collectively "sensing tabs 540"), a cathode 550, a cathode tab 560, sensing circuitry 570, and a battery management system 580. In some embodiments the sensing tabs 540 may correspond to the sensing tabs 410, 420, 430 illustrated as part of sensing sheet 400 in FIG. 4.

In the example of FIG. 5A, the battery cell 502, the anode tab 510, the anode 520, the separator 530, the sensing tabs 540, the cathode 550, the cathode tab 560, and the sensing circuitry 570 correspond to the battery cell 100, the anode tab 110, the anode 120, the separator 130, the sensing tabs 140, the cathode 150, the cathode tab 160, and the sensing circuitry 170, respectively, as described in FIG. 1. In contrast to FIG. 1, in the example of FIG. 5A, system 500A further includes a battery management system 580. Battery management system 580 is communicatively connected to the battery cell 502. In one example, the battery management system 580 is electrically connected to the battery cell 502 via electrical links (e.g., wires). In another example, the battery management system 580 may be wirelessly connected to the battery cell 502 via a wireless communication network. The battery management system 580 may be for example a microcontroller (with memory and input/output components on a single chip or within a single housing) or may include separately configured components, for example, a microprocessor, memory, and input/output components. The battery management system 580 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 580 may also include a user interface, a communication interface, and other computer implemented devices for performing features not defined herein may be incorporated into the system. In some example, the battery management system 580 may include other computer implemented devices such as a communication interface, a user interface, a network communication link, and an interface bus for facilitating communication between various interface devices, computing implemented devices, and one or more peripheral interfaces to the microprocessor.

The memory of the battery management system 580 may include computer-readable instructions that, when executed by the electronic processor of the battery management system 580, cause the battery management system and, more particularly the electronic processor, to perform or control the performance of various functions or methods attributed to battery management system 580 herein (e.g., detection of an internal short from a dendrite formation, identification of dendrite material, and/or mitigation of the internal short). The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 580 herein may be embodied as software, firmware, hardware or any combination thereof. In one example, the battery management system 580 may be embedded in a computing device and the sensing circuitry 570 is configured to communicate with the battery management system 580 of the computing device external to the battery cell 502. In this example, the sensing circuitry 170 is configured to have wireless and/or wired communication with the battery management system 580. For example, the sensing circuitry 570 and the battery management system 580 of the external device are configured to communicate with each other via a network. In yet another example, the battery management system 580 is remotely located on a server and the sensing circuitry 570 is configured to transmit data of the battery cell 502 to the battery management system 580. In the above examples, the battery management system 580 is configured to receive the data and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, a cloud computing network, or other suitable network.

The battery management system 580 is configured to receive data from the sensing circuitry 570 including current, voltage, and/or resistance measurements. Battery management system 580 is also configured to determine a condition of the battery cell 502. Based on the determined condition of battery cell 502, the battery management system 580 may alter the operating parameters of the battery cell 502 to maintain the internal structure of the battery cell 502. The battery management system 580 may also notify a user of the condition of the battery cell 502.

Figure 5B:
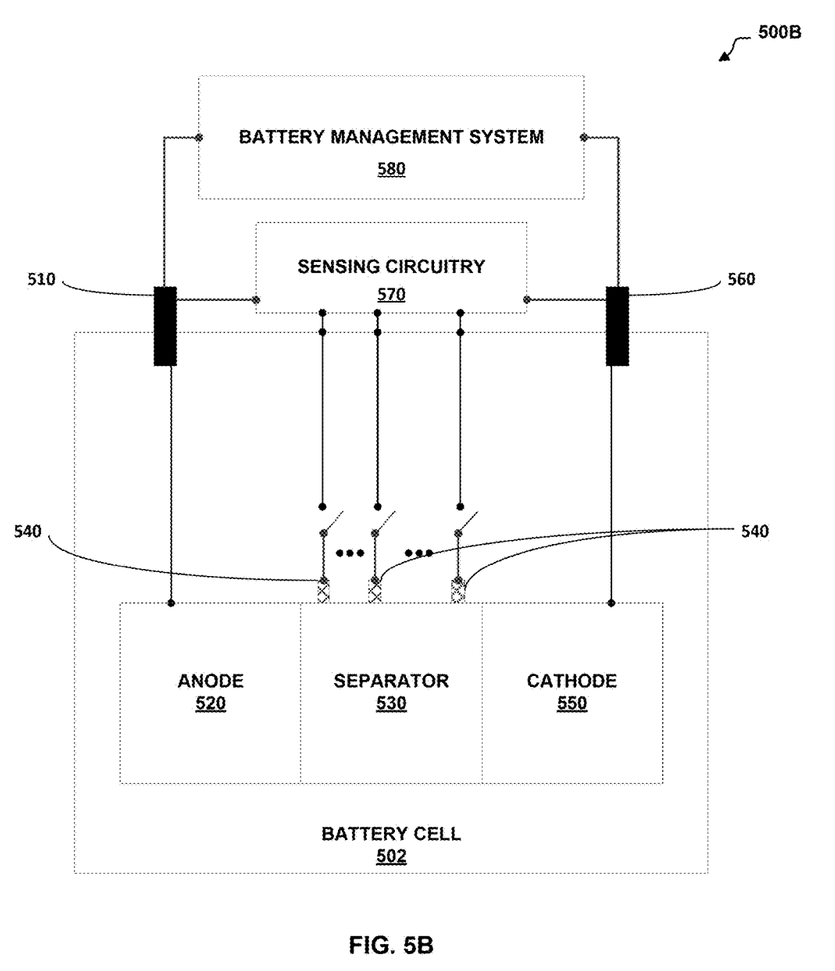

Another embodiment is shown in the example of FIG. 5B as a system 500B. The system 500B of FIG. 5B is similar to the system 500A of FIG. 5A, except, the sensing circuitry 570 is external to the battery cell 502. As illustrated in FIG. 5B, the sensing circuitry 570 is separate from the battery cell 502 and the battery management system 580. It should be understood that the specific type, number, and configuration of the components, including sensing circuitry 570, are provided as examples in systems 500A and 500B in FIGS. 5A and 5B, respectively. In other embodiments, the systems 500A and 500B in FIGS. 5A and 5B may include fewer or additional components in different combinations and configurations than illustrated in FIGS. 5A and 5B. For example, in other embodiments, the sensing circuitry 570 is part of the battery management system 580, and the battery management system 580 is directly connected to the sensing tabs 540 within the battery cell 502.

Figure 6:
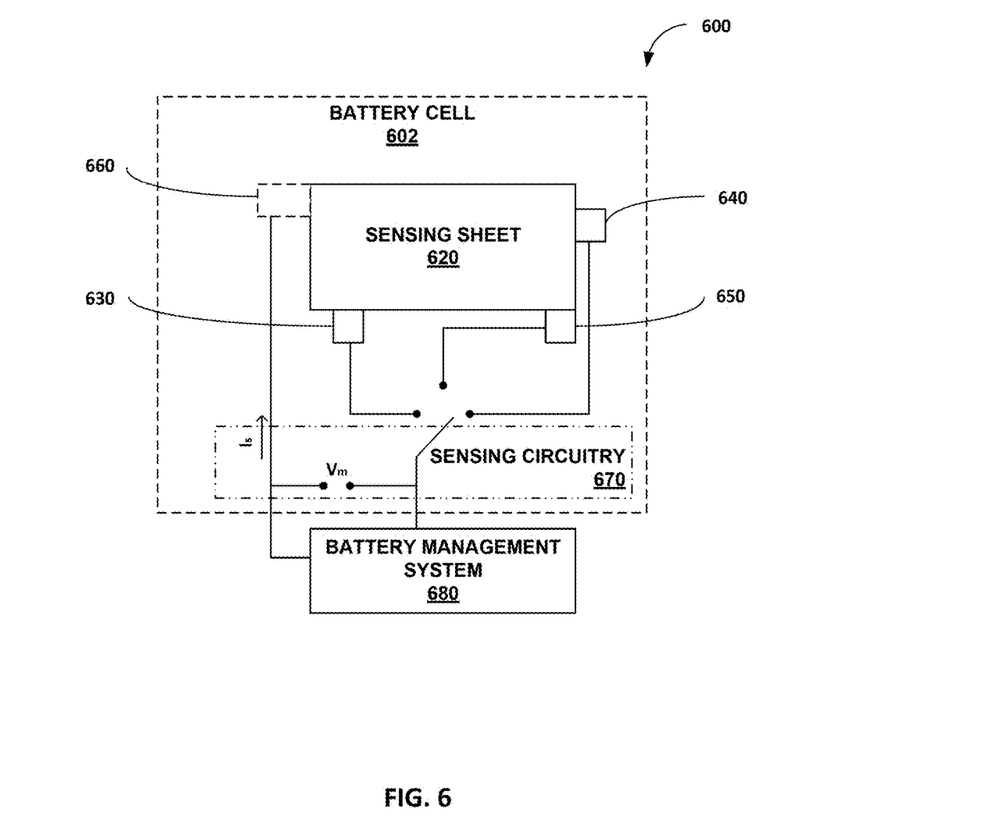
FIG. 6 is a schematic illustration of a battery system including a battery sensing sheet and battery management system, in accordance with one embodiment.

An embodiment of a system 600 is shown in FIG. 6. In the example of FIG. 6, the system 600 includes a battery cell 602, a sensing sheet 620, sensing sheet tabs 630, 640, and 650, an anode current collector tab 660, a sensing circuitry 670, and a battery management system 680. In the example of FIG. 6, the battery cell 602, the sensing circuitry 670, and the battery management system 680 correspond to the battery cell 502, the sensing circuitry 570, and the battery management system 580 as described in FIGS. 5A and 5B.

The battery management system 680 uses the sensing circuitry 670 to collect voltage and/or current data between the anode current collector tab 660 and the sensing sheet 620. For example, the sensing circuitry 670 may individually measure the voltage and/or current between each of the sensing tabs 630, 640, and 650 and the anode current collector tab 660. The measured parameters are then used by the battery management system 680 to determine conditions within the battery cell 602.

To detect a dendrite formation, battery management system 680 can detect an electrical circuit formed between the sensing tabs 630, 640, and 650, and the anode current collector tab 660. The voltage $V_m$ measured between each sensing tab 630, 640, and 650 and the anode current collector tab 660, and the applied current $I_s$ to anode current collector tab 660 can be used by the battery management system 680 to determine additional information about the internal short. For example, the battery management system 680 may determine the position (e.g., a two-dimensional position) and resistance of the dendrite. Upon determination of the position and resistance, the battery management system 680 may also identify the dendrite material based on the determined resistance. Identification of the dendrite material may allow the battery management system 680 to perform additional actions (e.g., actions to mitigate the potential effects of the dendrite within the battery cell 602).

By determining the presence of a dendrite between the anode (not shown) and sensing sheet 620 prior to the dendrite penetrating through the separator region and potentially forming an internal short between the anode and cathode of the battery corrective actions may be taken. The battery management system 680 may take various actions depending on the composition, number, and location of the detected dendrites. For example, if a dendrite is composed of lithium, the battery management system 680 may cause or provide a current to flow through the dendrite sufficient to raise the temperature of the dendrite above the melting point of lithium, about 180 degrees Celsius, in order to melt and eliminate the internal short caused by the dendrite. If, the dendrite is composed of a higher melting material, such as copper, iron, nickel, chromium, cobalt, or manganese, the battery management system 680 may advise a user that the battery needs to be serviced. For example, the battery management system 680 may advise a technician to replace a particular battery cell (e.g., the battery cell 602). In this example, the battery management system 680 may also advise a technician that a dendrite is forming and that the dendrite cannot be mitigated by thermal treatment. In some examples, the battery management system 680, the user, or the technician can initiate a shutdown protocol for the battery allowing the battery to be serviced.

FIG. 6 illustrates a sensing sheet 620 having three sensing tabs 630, 640, and 650 along the periphery of the sensing sheet 620, however, additional sensing tabs may be included provided the sensing tabs remain electrically separate from each other.

Although the sensing circuitry 670 has been described herein as measuring electrical parameters between each of sensing tabs 630, 640, and 650 and anode current collector tab 660, the sensing circuitry 670 may also be used to measure electrical parameters between each of sensing tabs 630, 640, and 650 and a cathode current collector tab. A similar system to system 600 illustrated in FIG. 6 may be used to detect and identify internal shorts formed on the cathode. For example, the electrolyte may contain additives that polymerize when the cathode reaches a high potential. The resulting polymer is slightly electrically conductive and can create a highly resistive internal short through the separator that may cause the battery management system 680 to shut down the cell in a safe manner. A battery structure having a sensing sheet as part of the separator region could potentially detect the formation of such internal shorts and advise the user to replace the affected battery cell.

The resistance between the anode current collector tab 660 and each of the sensing tabs 630, 640, and 650 includes several components in series. The first resistance component is the negative tab/negative current collector contact resistance. The second resistance component is the resistance in the negative electrode from the negative tab to the internal short. The third resistance component is the internal short resistance. The fourth resistance component is the resistance in the sensing sheet from the internal short to the sensing tab. The fifth resistance component is the sensing sheet/sensing tab contact resistance.

Welding at the sensing tabs 630, 640, and 650 is expected to minimize the tab contact resistances, or, if significant, the contact resistances can be measured a priori, whereas the resistance in the anode should be much lower than that in the sensing sheet 620. For example, compare a typical copper current collector thickness of 10 micrometers or more to a sensing sheet thickness of about 50 nm to 100 nm, which yields a resistance in the sensing sheet 620 that is on average two orders of magnitude higher than that in the anode. The resistances of typical dendrites (e.g., a copper or lithium dendrites with about a 1-micrometer diameter through a 25-micrometer separator) are roughly the same order of magnitude of the resistance through the sensing sheet 620 (e.g., 50-nm thick sheet with 5-cm width and 5-cm length).

Figure 7:
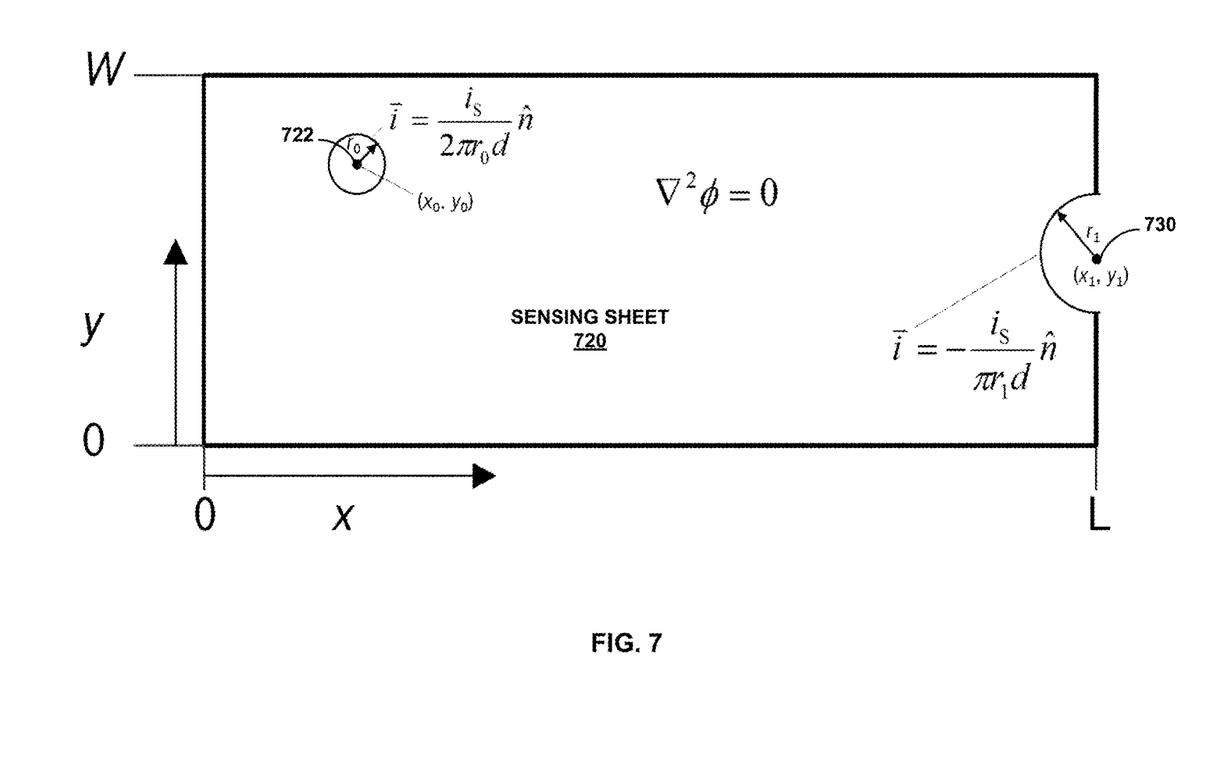
FIG. 7 is a schematic illustration of a sensing sheet within a battery, in accordance with one embodiment.

The battery management system 680 may perform the following determinations as illustrated in FIG. 7 and as described below to determine the resistance of the internal short 722 and its position on the sensing sheet 720, which corresponds to the sensing sheet 620 as described in FIG. 6. For ease of understanding, the following description assumes all resistances other than the dendrite resistance and the sensing sheet resistances are negligible. First, the battery management system 680 may use the origin of the two dimensional space at one corner of the sensing sheet 720. Relative to the origin, the internal short 722 is located at the unknown position $(x_0, y_0)$, and the location of one of the sensing tabs 730 is at the known coordinate $(x_1, y_1)$. The length and width of the sensing sheet 720 are L and W, respectively. The battery management system 680 may define a circle with radius $r_0$ centered at $(x_0, y_0)$ around the internal short 722 and a semicircle of radius $r_1$ centered at $(x_1, y_1)$ around the sensing tab 730. In measuring the voltage $V_m$ of the sensing circuit, a very small current $i_s$ is applied such that the total DC resistance of the sensing circuit is obtained by dividing the measured voltage, $V_m$, by the applied current, $i_s$, as defined by Equation 1.

$$R_{DC} = R_S + R_{ss} = V_m / i_s \qquad (1)$$

In Equation 1, $R_S$ is the resistance of the internal short 722 and $R_{ss}$ is the resistance of the sensing sheet 720.

In the limits $r_0 \to 0$ and $r_1 \to 0$, the current density can be approximated as uniform in all directions normal to the circle as defined by Equation 2 and semicircle as defined by Equation 3, $$\vec{i} = \frac{i_S}{2\pi r_0 d} \hat{n} \qquad (2)$$

$$\vec{i} = -\frac{i_S}{\pi r_1 d} \hat{n} \qquad (3)$$

In Equations 2 and 3, d is the thickness of the sensing sheet and $\hat{n}$ is the unit normal with respect to the circle or semicircle in the x-y plane. Written as components $i_x$ and $i_y$, Equations 2 and 3 can redefined as Equations 4 and 5 for the circle and semicircle, respectively.

$$i_x = \frac{i_S}{2\pi r_0^2 d}(x - x_0), \ i_y = \frac{i_S}{2\pi r_0^2 d}(y - y_0) \qquad (4)$$

$$i_x = -\frac{i_S}{\pi r_1^2 d}(x - x_1), \ i_y = \frac{i_S}{\pi r_1^2 d}(y - y_1) \qquad (5)$$

In general, $r_0 < r_1 \ll W < L$, the battery management system 680 can use the above approximation in computing the voltage drop between the internal short 722 and the sensing tab 730.

Within the region of the sensing sheet 720 that is outside the circle and semicircle, there are no additional current sources or sinks, and therefore Laplace's equation holds as defined by Equation 6.

$$\nabla^2 \phi = 0 \qquad (6)$$

In Equation 6, $\phi$ is the potential in the sensing sheet 720. This is derived from the current balance as defined by Equation 7 and Ohm's law as defined by Equation 8.

$$\nabla \cdot \vec{i} = 0 \quad (7)$$

$$\vec{i} = -\sigma \nabla \phi \quad (8)$$

Both Equations 7 and 8 apply in the region of the sensing sheet 720 outside the circle and semicircle. The battery management system 680 may establish an arbitrary reference voltage. For example, the battery management system 680 may prescribe the reference voltage at the origin as defined by Equation 9.

$$\phi(0,0) = 0 \quad (9)$$

The voltage drop and effective resistance through the sensing sheet 720 are defined by Equations 10 and 11.

$$V_{ss} = \phi(x_1, y_1) - \phi(x_0, y_0) \quad (10)$$

$$R_{ss} = V_{ss}/i_s \quad (11)$$

Since the value of $\phi$ is not computed explicitly at these positions, the battery management system 680 may approximate the potentials by averaging the values of the potential at the respective peripheries of the circle and semicircle.

Figure 8:
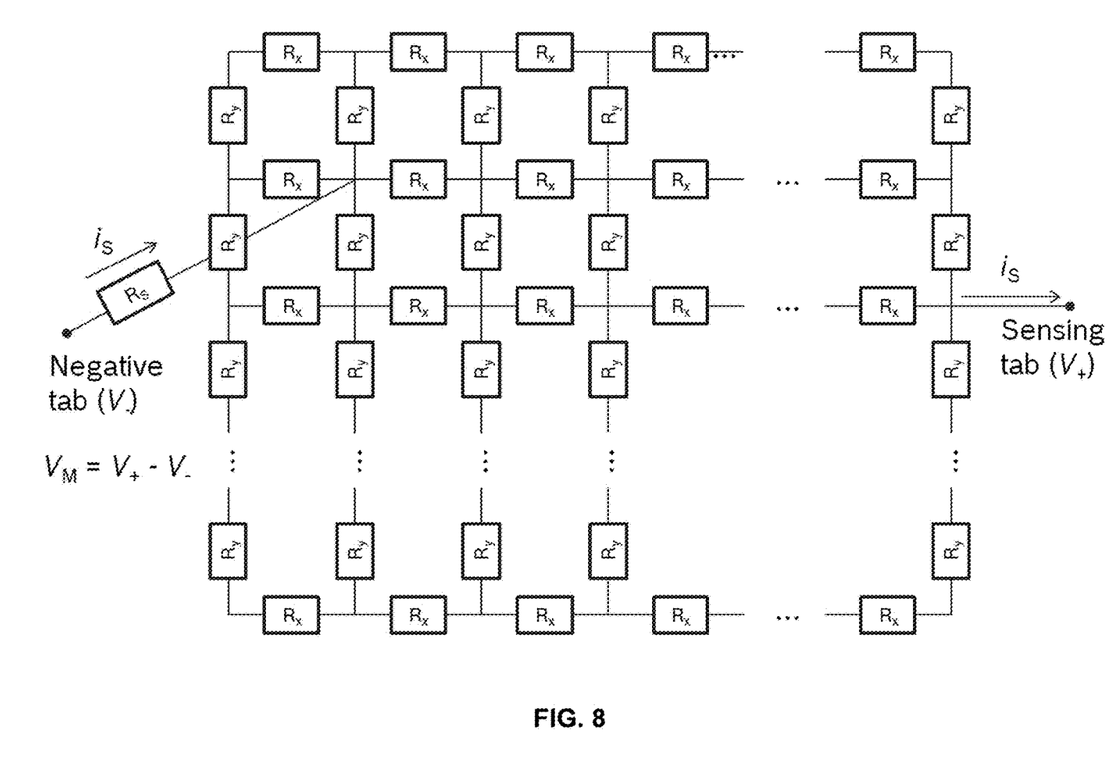
FIG. 8 is a schematic illustration of a sensing sheet within a battery, in accordance with one embodiment.

A variety of methods can be employed by the battery management system 680 to solve the above set of equations to derive the effective sensing sheet resistance or voltage drop, provided the position and resistance of the internal short 722 is known. In one example method, the battery management system 680 may map the rectangular domain to the semi-infinite domain via a Schwarz-Christoffel transformation, with the solution to Laplace's equation derived in the semi-infinite domain, and the battery management system 680 may map the solution back to the rectangular domain. In another example method, the battery management may solve Laplace's equation in the rectangular domain via a separation of variables, which results in a series expansion solution in x and y for the potential. In yet another example method, the battery management system 680 may compute Laplace's equation numerically using finite difference, finite volume, control volume, or other numerical methods. In another example method, as illustrated in FIG. 8, the battery management system 680 may approximate the sensing sheet 720 as a discrete network of resistors in two dimensions and solve the equations that result from Kirchoff's current and voltage laws.

Additionally, the position ($x_0$, $y_0$) and resistance ($R_S$) of the internal short 722 can be determined from at least three independent measurements of the total DC resistance. The battery management system 680 may measure the voltage drop between the anode tab and three or more separate sensing tabs along the periphery of the sensing sheet 720. In some examples, if three different tabs exist at different locations on the periphery, then the battery management system 680 can similarly provide three different measurements of the total sensing circuit resistance by alternately closing the circuit to each of the three tabs. In other examples, more than three different measurements may be used to determine a unique solution to the set of variables ($R_S$, $x_0$, $y_0$).

The battery management system 680 may measure the voltage of the sensing circuit subject to an imposed current of known quantity, which is one technique for obtaining the values of the resistance and position of the internal short 722. Additionally or alternatively, in some examples, the resistance of each sensing circuit may be measured by applying a specified voltage and measuring the current.

Figure 9:
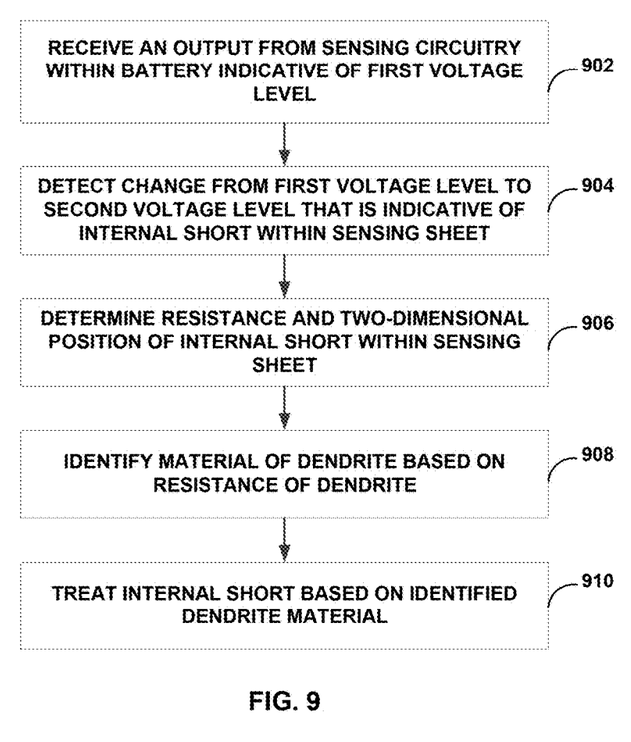
FIG. 9 is a flowchart illustrating an example method of identifying the presence of an internal short in a battery, in accordance with one embodiment.

A flowchart of the operation of an embodiment of the battery management system 580 of FIG. 5 for the detection of an internal short is presented in FIG. 9. FIG. 9 is described with reference to the system 500A of FIG. 5A. The battery management system 580 receives an output from the sensing circuitry 570 indicative of a first voltage level (block 902). The battery management system 580 detects a change from the first voltage level to a second voltage level that is indicative of an internal short within the sensing sheet (block 904). The battery management system 580 determines the resistance and location of the internal short within the sensing sheet (block 906). The battery management system 580 identifies the material of the dendrite based on the determined resistance of the dendrite (block 908). In some examples, the battery management system 580 may treat the internal short based on the identified dendrite material (block 910).

Figure 10:
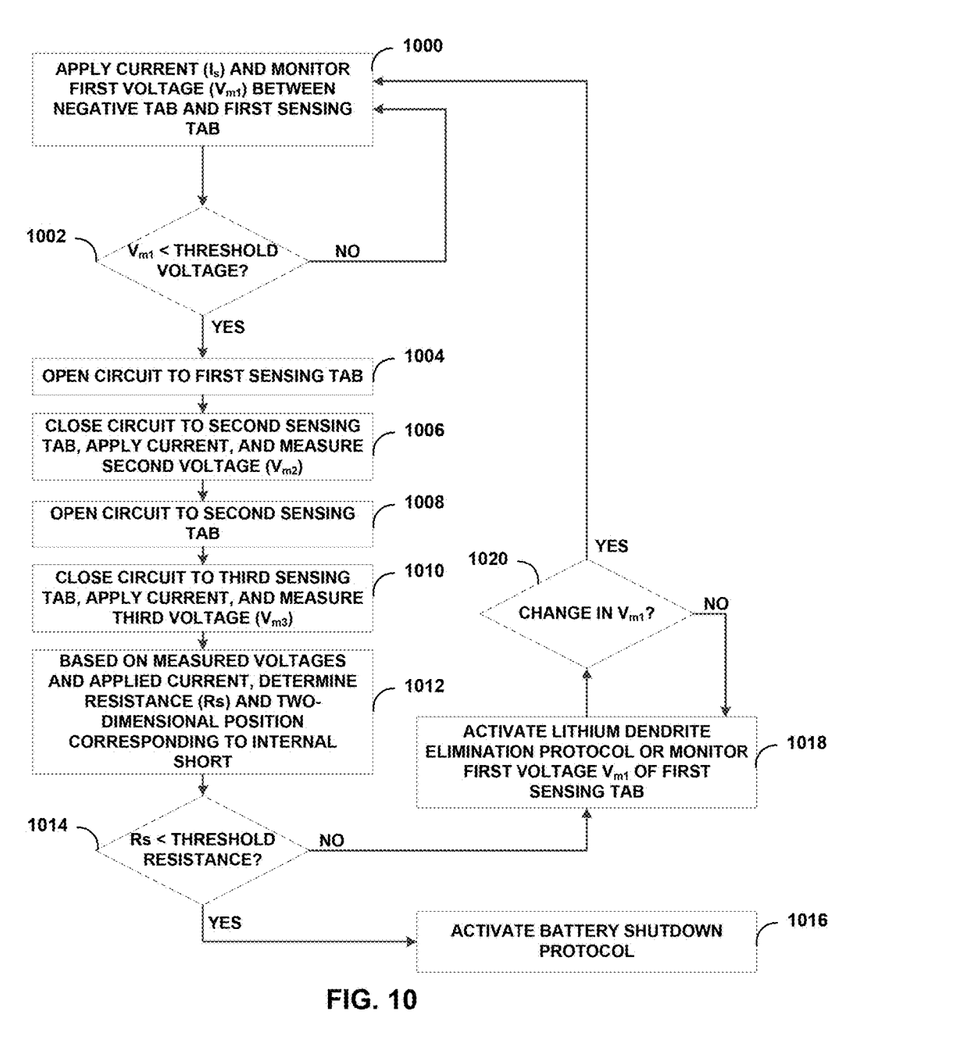
FIG. 10 is a flowchart illustrating an example method of identifying and treating the presence of an internal short in a battery, in accordance with one embodiment.

A flowchart of the operation of an embodiment of the battery management system 680 for the detection of an internal short is presented in FIG. 10. FIG. 10 is described with reference to system 600 of FIG. 6. The battery management system 680 applies a current $i_s$ and monitors a first voltage level ($V_{m1}$) between the anode current collector tab 660 and a first sensing tab 630 (block 1000). If the battery management system 680 does not detect a change in the first voltage level (NO at decision block 1002), then the battery management system 680 continues to monitor the first voltage level (block 1000). However, if the battery management system 680 detects that the first voltage level is less than a threshold voltage level (YES at decision block 1002), then the battery management system 680 opens the circuit to the first sensing tab 630 (block 1004). The battery management system 680 closes the circuit to a second sensing tab 640, applies the current $i_s$, and measures a second voltage level ($V_{m2}$) (block 1006). After measuring the second voltage level, the battery management system 680 opens the circuit to the second sensing tab 640 (block 1008). The battery management system 680 closes the circuit to a third sensing tab 650, applies the current $i_s$, and measures a third voltage level ($V_{m3}$) (block 1010). Based on the measured voltage levels and applied currents, the battery management system 680 determines the resistance, Rs, and two-dimensional position corresponding to the internal short (block 1012). In some examples, the battery management system 680 may determine a treatment based on the determined resistance, Rs, of the internal short.

The battery management system 680 determines whether the resistance (Rs) is below a threshold resistance. If the battery management system 680 detects that the resistance (Rs) is above a threshold resistance (NO at decision block 1014), the battery management system 680 either activates a dendrite elimination protocol to eliminate the dendrite or monitor the first voltage level of the first sensing tab 630 (block 1018). In some examples, the dendrite elimination protocol may include a current through the internal short sufficient to heat the dendrite above the melting point of the dendrite. For example, the battery management system 680 may identify the dendrite as a lithium dendrite, and the battery management system 680 may pass a current through the lithium dendrite that raises the temperature above 180 degrees Celsius to melt the lithium dendrite. The applied current will also raise the temperature of the parts of the sensing circuit through which the current flows. In some embodiments, the circuit of the applied current may be alternated between different sensing tabs 630, 640, 650 in order to limit the amount of heating of any given part of the sensing sheet 620, while localizing the region of continuous heating to the internal short itself. In some embodiments additional sensing tabs may be added to further differentiate between the sensing sheet 620 and the internal short when raising the temperature of the cell. The battery management system 680 may activate the dendrite elimination protocol or continue monitoring the first voltage level when there is no change in the first voltage level (NO at decision block 1020). However, the battery management system 680 may deactivate the dendrite elimination protocol and restart the dendrite identification process when there is a change in the first voltage level (YES at decision block 1020).

If the battery management system 680 detects that the resistance (Rs) is below a threshold resistance (YES at decision block 1014), the battery management system 680 activates a battery shutdown protocol. In some examples, the resistance (Rs) of copper is below the predetermined threshold that will cause the battery management system 680 to activate the battery shutdown protocol.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

It is believed that embodiments described herein and many of their attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for identifying a material type of a dendrite causing an internal short within a battery, the method comprising:
    receiving, by a battery management system, an output from sensing circuitry within the battery indicative of a first voltage level;
    detecting, by the battery management system, a change from the first voltage level to a second voltage level that is indicative of the internal short between an electrode and a sensing sheet;
    determining by the battery management system, a resistance and a two-dimensional position of the internal short on the sensing sheet; and
    identifying, by the battery management system, the material type of the dendrite causing the internal short based on the resistance of the internal short; and
    treating, by the battery management system, the internal short based on the identification of the material type of the dendrite,
    wherein treating the internal short based on the identification of the material type of the dendrite further includes activating, by the battery management system, a dendrite elimination protocol, wherein the dendrite elimination protocol includes providing a current through the internal short, and wherein the current is sufficient to raise a temperature of the dendrite above a melting point of the material type of the dendrite.

2. The method of claim 1, wherein receiving, by the battery management system, the output from the sensing circuitry within the battery indicative of the first voltage level includes applying a current and monitoring the first voltage level between an anode and a first sensing tab.

3. The method of claim 1, wherein detecting, by the battery management system, the change from the first voltage level to the second voltage level that is indicative of the internal short between the electrode and the sensing sheet comprises detecting, by the battery management system, when the first voltage level is less than a threshold voltage level.

4. The method of claim 1, wherein determining by the battery management system, the resistance and the two-dimensional position of the internal short on the sensing sheet includes
    applying a current and measuring a voltage level between an anode and a first sensing tab;
    applying a current and measuring a voltage level between the anode and a second sensing tab;
    applying a current and measuring a voltage level between the anode and a third sensing tab; and
    based on at least the applied currents and the measured voltage levels of the at least three sensing tabs, determine the resistance and the two-dimensional position corresponding to the internal short.

5. The method of claim 1, wherein identifying, by the battery management system, the material type of the dendrite causing the internal short based on the resistance of the internal short further includes determining, by the battery management system, whether the resistance of the internal short is below a threshold resistance.

6. The method of claim 1, wherein identifying the material type of the dendrite causing the internal short based on the resistance of the internal short further includes identifying the material type of the dendrite as a lithium-ion material type based on the resistance of the internal short.

* * * * *